United States Patent
Leobandung (10) Patent No.: US 9,099,412 B2
(45) Date of Patent: Aug. 4, 2015

(54) SELECTIVE LASER ANNEAL ON SEMICONDUCTOR MATERIAL

(71) Applicant: International Business Machines Corporation, Armonk, NY (US)

(72) Inventor: Effendi Leobandung, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/922,424

(22) Filed: Jun. 20, 2013

(65) Prior Publication Data

US 2014/0377925 A1    Dec. 25, 2014

(51) Int. Cl.
H01L 21/324    (2006.01)

(52) U.S. Cl.
CPC .................................... *H01L 21/324* (2013.01)

(58) Field of Classification Search
CPC .............. H01L 27/0605; H01L 21/324; H01L 21/823418; H01L 21/823814
USPC .......................................................... 438/199
See application file for complete search history.

(56) References Cited

U.S. PATENT DOCUMENTS

| | | | |
|---|---|---|---|
| 4,939,114 A | 7/1990 | Nojiri et al. | |
| 7,354,792 B2 | 4/2008 | Carey, III et al. | |
| 7,605,064 B2 | 10/2009 | Kizilyalli et al. | |
| 7,718,554 B2 | 5/2010 | Yoo et al. | |
| 8,232,114 B2 | 7/2012 | Lin et al. | |
| 2002/0008234 A1* | 1/2002 | Emrick et al. | 257/43 |
| 2010/0190274 A1 | 7/2010 | Lin et al. | |
| 2012/0225568 A1 | 9/2012 | Izawa et al. | |
| 2013/0288438 A1* | 10/2013 | Jensen et al. | 438/197 |

FOREIGN PATENT DOCUMENTS

| | | |
|---|---|---|
| KR | 1020070120611 | 12/2007 |
| KR | 1020090127360 | 12/2009 |

OTHER PUBLICATIONS

Schroder et al., "Free Carrier Absorption in Silicon," IEEE Journal of Solid-State Circuits, Feb. 1978, pp. 180-187, vol. SC-13, No. 1.
Feng et al., "Minimizing Pattern Dependency in Millisecond Annealing," IEEE, Junction Technology, International Workshop on Mar. 2006, pp. 25-30, Shanghai.

* cited by examiner

*Primary Examiner* — Yu-Hsi D Sun
(74) *Attorney, Agent, or Firm* — Scully, Scott, Murphy & Presser, P.C.; Louis J. Percello, Esq.

(57) ABSTRACT

A method of forming a semiconductor device including providing a substrate having a first region of a first semiconductor material and a second region of a second semiconductor material and forming a first gate structure in a first region of the semiconductor material and a second gate structure in a second region of the substrate. A first source region and a first drain region is implanted in the first region of the substrate. The dopant for the first source region and the first drain region is not implanted into the second region. The first source region and the first drain region are then activated with a laser anneal. A second source region and a second drain region are implanted in the second region of the substrate after activating the first source region and the first drain region. The second source region and the first source region may then be activated.

20 Claims, 4 Drawing Sheets

SELECTIVE LASER ANNEAL ON SEMICONDUCTOR MATERIAL

BACKGROUND

The present disclosure relates generally to semiconductor devices. More particularly, the present disclosure relates to semiconductor devices formed using compound semiconductor materials.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor materials, such as compound semiconductors have been considered.

SUMMARY

A method of forming a semiconductor device that includes providing a substrate having a first region of a first semiconductor material and a second region of a second semiconductor material, and forming a first gate structure in the first region of the substrate and a second gate structure in the second region of the substrate. A first source region and a first drain region may then be implanted in the first region of the substrate. The dopant for the first source region and the first drain region is not implanted into the second region of the substrate. The first source region and the first drain region may be activated with a laser anneal. A second source region and a second drain region may be implanted into the second region of the substrate after activating the first source region and the first drain region. The second source region and the second drain region may then be activated.

In another embodiment, a method of forming a semiconductor device is provided that includes providing a substrate having a first region of a type IV semiconductor material and a second region of a compound semiconductor; and forming a first gate structure in the first region of the substrate and a second gate structure in the second region of the substrate. A first source region and a first drain region may be implanted into the first region of the substrate. The dopant for the first source region and the first drain region is not implanted into the second region. The first source region and first drain region may then be activated with a laser anneal having a wavelength ranging from 10 µm to 1 mm. A second source region and a second drain region may be implanted in the second region of the substrate after the activating the first source region and the first drain region. The second source region and the first source region may be activated with a thermal anneal at a temperature of 700° C. or less.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

In some embodiments, the method and structures disclosed herein can incorporate multiple semiconductor devices of different materials on the same substrate. In some electrical device applications, there is a need to incorporate multiple semiconductor materials into the same chip. For example, it can be desirable to incorporate semiconductor devices composed of type IV semiconductors, such as silicon containing semiconductors, with semiconductor devices composed of a compound semiconductor materials, such as III-V compound semiconductor materials, on the same chip. Type IV semiconductors, such as silicon containing semiconductor materials, and compound semiconductors, such as III-V compound semiconductor materials, may have different thermal requirements. For example, the activation temperature of the source and drain regions of a semiconductor device composed of a type IV semiconductor material, such as a silicon containing semiconductor material, is typically greater than 1000° C., whereas the activation temperature of the source and drain regions of a semiconductor device composed of a compound semiconductor, such as a III-V compound semiconductor material, typically can not withstand temperatures greater than 600° C. In some examples, at temperatures greater than 600° C., a compound semiconductor, such as a III-V compound semiconductor material may degrade on a crystalline level. For example, compound semiconductors tend to disassociate at these high temperatures.

In some embodiments, the methods and structures disclosed herein provide a laser annealing step with a far infrared wavelength, e.g., 10 µm to 1 mm, to activate the source and drain regions of a semiconductor device formed of a type IV semiconductor material, such as a silicon containing material. The laser annealing step is selective to the doped regions of the type IV semiconductor material. In this manner, a semiconductor device composed of a compound semiconductor, e.g., type III-V compound semiconductor, may not be impacted by the annealing step that is employed to activate the source and drain regions of a semiconductor device composed of a type IV semiconductor material, in which the semiconductor device composed of the type IV semiconductor material and the semiconductor device composed of the compound semiconductor material are present on the same substrate.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. By "same substrate" it is meant that a first semiconductor device comprised of a first semiconductor material, e.g., type IV semiconductor, and a second semiconductor device comprised of a second semiconductor material, e.g., compound semiconductor, are present simultaneously on the same substrate in different regions of the same substrate.

FIGS. 1-4 depict one embodiment of a method of fabricating a first semiconductor device 100a on a first region 20 of a substrate 5 having a first semiconductor material surface 3, e.g., type IV semiconductor material, and a second semiconductor device 100b on a second region 25 of the substrate 5 having a second semiconductor material surface 4, e.g., compound semiconductor material, wherein the semiconductor devices 100a, 100b have a planar orientation. The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. In one embodiment, the planar semiconductor device is a field effect transistor. As used herein a "field effect transistor" is a transistor in which output current, i.e., source-drain current, is controlled by the voltage applied to a gate structure. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain.

Figure 1:
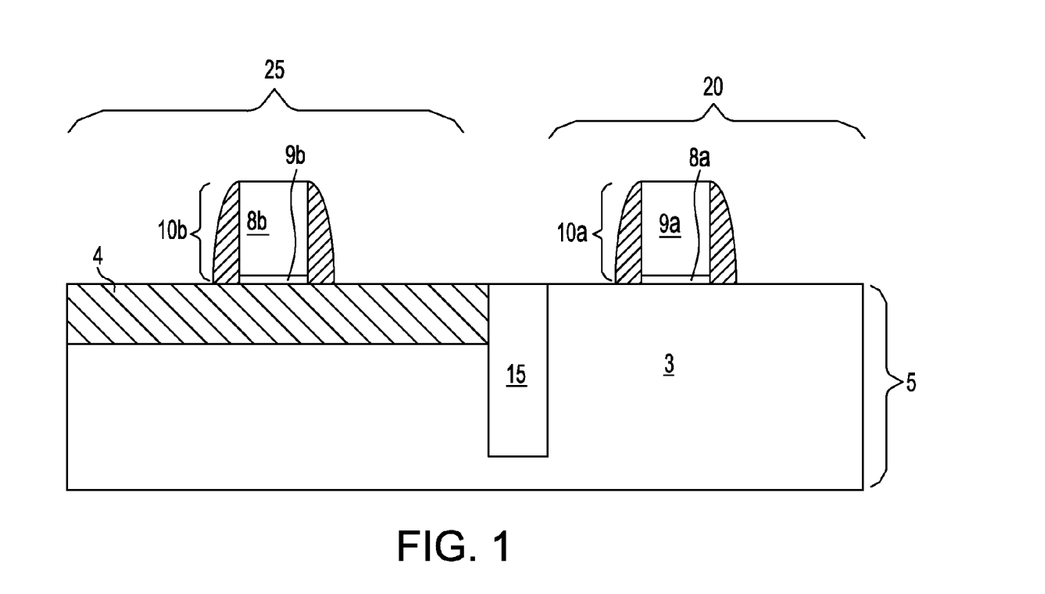
FIG. 1 is a side cross-sectional view of one embodiment of an initial structure used in accordance with the methods of the present disclosure, wherein the initial structure includes a substrate having a first region of a first semiconductor material and a second region of a second semiconductor material, in which a first gate structure is present in the first region of the substrate and a second gate structure is present in the second region of the substrate.

FIG. 1 depicts one embodiment of a substrate 5 having a first region 20 of a first semiconductor material 3 and a second region 25 of a second semiconductor material 4, and forming a first gate structure 10a in the first region 20 of the substrate 5 and a second gate structure 10b in the second region 25 of the substrate 5. In some embodiments, the substrate 5 is a bulk substrate being composed of a type IV semiconductor material. A type IV semiconductor material. As used herein, a "type IV" semiconductor material is a semiconductor element from the Periodic Table of Elements consisting of carbon (C), silicon (Si), germanium (Ge), tin (Sn), lead (Pb), and flerovium (Fl). In the International Union of Pure and Applied Chemistry (IUPAC) notation, it is called Group 14. In the field of semiconductor physics, it is called Group IV consistent with the chemical abstracts system (CAS), which identifies the group as Group IVA. In some embodiments, the type IV semiconductor material that provides the substrate 5 is selected from the group consisting of Si, strained Si, SiC, SiGe, SiGeC, Si alloys, Ge, Ge alloys and combinations thereof. Although the substrate 5 is depicted as being a bulk substrate, embodiments have been contemplated in which the substrate 5 is provided by as semiconductor on insulator (SOI) substrate, such as a silicon on insulator substrate.

In some embodiments, a portion of the substrate 5 of the type IV semiconductor material provides the first region 20 of the substrate having the surface of the first semiconductor material 3, whereas another portion of the substrate 5 is processed to provide the second region 25 of the substrate 5 having the surface of a second semiconductor material 4 that is different from the first semiconductor material 3. For example, in some embodiments, when the first semiconductor material 3 in the first region 20 of the substrate 5 is composed of a type IV semiconductor material, such as silicon, the second region 25 of the substrate 5 may be processed to provide a surface of a compound semiconductor material, such as a type III-V compound semiconductor material. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In some embodiments, the second semiconductor material 4 that provides the second semiconductor material surface may be formed on the substrate 5 using an epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the compound semiconductor material typically ranges from 550° C. to 900° C. Although higher temperature typically results in faster deposition, the faster deposition may result in crystal defects and film cracking.

In some embodiments, epitaxial growth and/or deposition processes are selective to forming on semiconductor surface, and do not deposit material on dielectric surfaces, such as silicon oxide surfaces, silicon nitride surfaces and photoresist materials. In some embodiments, the III-V compound semiconductor that provides the second semiconductor material is selectively deposited in the second region 25 of the substrate 5 by forming a photoresist block mask over the first region 20 of the substrate, while leaving the second region 25 exposed. This provides an exposed deposition surface, i.e., the second region 25, for depositing the epitaxial formed III-V compound semiconductor material that provides the second semiconductor material in the second region 25 of the substrate 5, while obstructing the III-V compound semiconductor material from being formed in the first region 20. In some examples, an etch process may be applied to the second region 25 of the substrate 5 prior to depositing the second semiconductor material, e.g., the III-V compound semiconductor material. In this manner, by recessing the upper surface of the substrate 5 in the second region 25 prior to depositing the III-V compound semiconductor material for the second semiconductor material 4, the upper surface of the deposited second semiconductor material 4 that is formed on the recessed surface of the substrate 5 within the second region 5 may be coplanar with the upper surface (not recessed) of the substrate 5 that is present in the first region 20. A planarization process, such as chemical mechanical planarization (CMP), may be employed to facilitate that the upper surface of the first semiconductor material 3 in the first region 20 of the substrate 5 is coplanar with the upper surface of the second semiconductor material 4 in the second region 25 of the substrate 5.

In some embodiments, the first region 20 of the substrate 5 and the second region 25 of the substrate 5 may be separated from one another by an isolation region 7 that is positioned between the first and second regions 20, 25 of the substrate. In some embodiments, the isolation region 7 may be a shallow trench isolation (STI) region. The STI region may be formed by etching a trench in the substrate 5 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

FIG. 1 further depicts forming a first gate structure 10a in the first region 20 of the substrate 5, and forming a second gate structure 10b in the second region 25 of the substrate 5. The gate structure 10a, 10b may be formed using deposition, photolithography and etch processes. More specifically, and in some embodiments, at least one gate dielectric layer may be deposited on the upper surface of the first semiconductor material 3 in the first region 20 of the substrate 5, and the upper surface of the second semiconductor material 4 in the second region 25 of the substrate 5. The at least one gate dielectric layer that is formed in the first and second regions 20, 25 of the substrate may be composed of any dielectric material including oxides, nitrides and oxynitrides. In one embodiment, the least one gate dielectric layer may be provided by a high-k dielectric material, i.e., a dielectric material having a dielectric constant greater than silicon oxide. In one embodiment, the least one gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric layer include hafnium silicate, hafnium silicon oxynitride or combinations thereof. In one embodiment, the at least one gate dielectric layer may be deposited by chemical vapor deposition (CVD). Variations of CVD processes suitable for depositing the at least one gate dielectric layer include, but are not limited to, APCVD, LPCVD, PECVD, MOCVD, ALD and combinations thereof. In one embodiment, the thickness of the at least one gate dielectric layer is greater than 0.8 nm. More typically, the at least one gate dielectric layer has a thickness ranging from about 1.0 nm to about 6.0 nm.

In some embodiments, following the formation of the at least one gate dielectric layer on the first and second region 20, 25 of the substrate 5, at least one gate conductor layer may be formed on the at least one gate dielectric layer to provide a gate stack. The at least one gate conductor layer may be formed by a deposition process, such as CVD, plasma-assisted CVD, plating, and/or sputtering, followed by planarization. In one embodiment, the at least one gate conductor layer is composed of an undoped semiconductor. One example of an undoped semiconductor that is suitable for the at least one gate conductor layer is doped polysilicon.

The gate stack may then be patterned and etched to provide the first gate structure 10a in the first region 20 of the substrate 5, and the second gate structure 10b in the second region 25 of the substrate 5. Specifically, and in one example, a pattern is produced by applying a photoresist over the surfaces to be etched, i.e., at least one gate conductor layer and at least one gate dielectric layer, exposing the photoresist to a pattern of radiation, and then developing the pattern into the photoresist utilizing a resist developer. Once the patterning of the photoresist is completed, the sections of the gate stack covered by the photoresist are protected to provide the first and second gate structures 10a, 10b, while the exposed regions are removed using a selective etching process that removes the unprotected regions. Following etching, the remaining portions of the at least one dielectric layer provide the first and second gate dielectrics 8a, 8b of the first and second gate structures 10a, 10b, and the remaining portions of the at least one gate conductor provide the first and second gate conductors 9a, 9b of the first and second gate structures 10a, 10b. Following formation of the first and second gate structures 10a, 10b, the photoresist may be removed. In some embodiments, the gate structures 10a, 10b can be formed by a replacement gate process.

Figure 2:
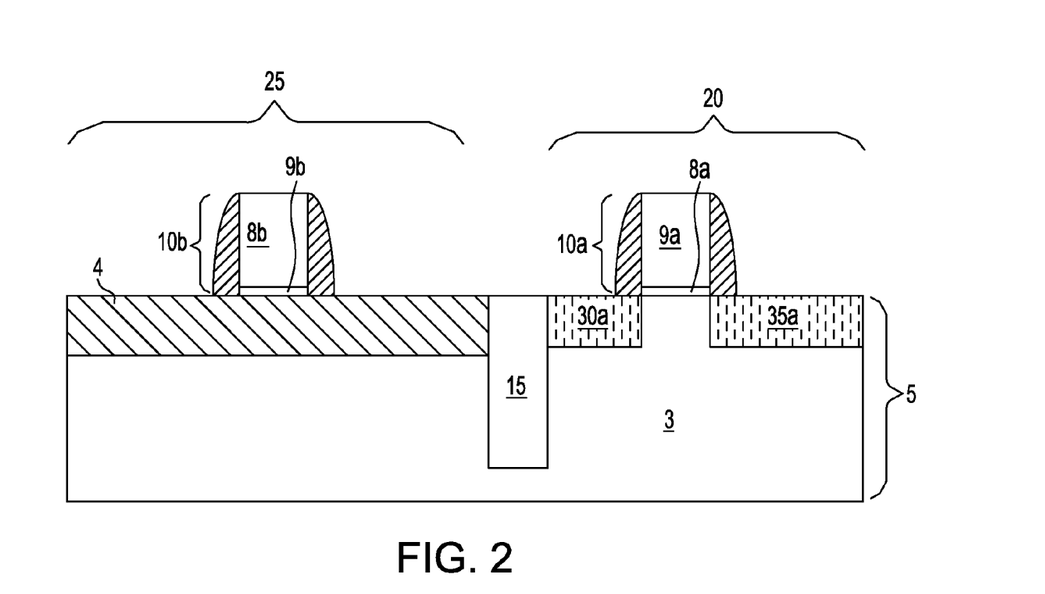
FIG. 2 is a side cross-sectional view depicting forming a first source region and a first drain region in the first region of the substrate, in accordance with one embodiment of the present disclosure.

FIG. 2 depicts one embodiment of forming a first source region 30a and a first drain region 35a in the first region 20 of the substrate 5. The first source region 30a and the first drain region 35a may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities include but are not limited to boron, aluminum, gallium and indium. "N-type" refers to the addition of impurities that contributes free electrons to an intrinsic semiconductor. In a silicon containing substrate examples of n-type dopants, i.e., impurities, include but are not limited to antimony, arsenic and phosphorous.

In one example, the first source region 30a and the first drain region 35a may be formed by ion implanting a p-type dopant into the first region 20 of the substrate 5. During the ion implantation steps for forming the first source region 30a and the first drain region 35a, the second region 25 of the substrate 5 may be protected from being implanted with the dopant that forms the first source region 30a and the first drain region 35a by a block mask. More specifically, prior to ion implantation of the dopant for the first source region 30a and the first drain region 35a, a block mask (not shown) may be formed overlying the second region 25 of the substrate 5, in which the block mask leaves the first region 20 of the substrate 5 exposed. The block mask may be composed of a photoresist material or may be composed of a hard mask material, such as silicon oxide or silicon nitride, that may be removed selectively to the underlying structure. The exposed portion, i.e., first region 20, of the substrate 5 that includes the first semiconductor material 3 is not protected by the block mask, and is ion implanted to provide the p-type first source and drain regions 30a, 35a, while the second region 25 of the substrate 5 is protected by the block mask.

By protecting the second region 25 of the substrate 5 with the block mask during the ion implantation steps that provide the first source and drain regions 30a, 35a, the second region 25 remains substantially free of the dopants that form the first source and drain regions 30a, 35a in the first region 20 of the substrate 5. The terms "substantially free of the dopants" as used to describe the second semiconductor material 4 of the second region 25 means that the dopant concentration in the second semiconductor material of the dopant that provides the first source and drain regions 30a, 35a is less than $1\times10^{18}$ atoms/cm$^3$. In one embodiment, the dopant concentration in the second semiconductor material 4 of the dopant that provides the first source and drain regions 30a, 35a is less than about $3\times10^{17}$ atoms/cm$^3$. In an even further embodiment, the dopant concentration in the second semiconductor material 4 of the dopant that provides the first source and drain regions 30a, 35a is less than about $1\times10^{17}$ atoms/cm$^3$. In yet another embodiment, the second semiconductor material 4 is entirely free of the dopant that provides the first source region and the first drain regions 30a, 35b for the time prior to the activation anneal for the first source region 30a and the first drain region 35a.

In one embodiment, when forming first source and drain regions 30a, 35a having a p-type conductivity, a typical dopant species is boron or BF$_2$. Boron may be implanted utilizing implant energies ranging from 0.2 keV to 3.0 keV with an implant dose ranging from $5\times10^{14}$ atoms/cm$^2$ to $5\times10^{15}$ atoms/cm$^2$. BF$_2$ may be implanted utilizing implant energies ranging from 1.0 keV to 15.0 keV and a dose ranging from $5\times10^{14}$ atoms/cm$^2$ to $5\times10^{15}$ atoms/cm$^2$. The concentration of the p-type dopant in the first source and drain regions 30a, 35a may range from $1\times10^{18}$ atoms/cm$^3$ to $8\times10^{21}$ atoms/cm$^3$. In another embodiment, the dopant concentration of the p-type dopant in the first source region 30a and the first drain region 35a ranges from $1\times10^{19}$ atoms/cm$^3$ to $3\times10^{20}$ atoms/cm$^3$. Following formation of the first source and drain regions 30a, 35a, the block mask that is present over the first region 20 of the substrate 5 is removed.

Figure 3:
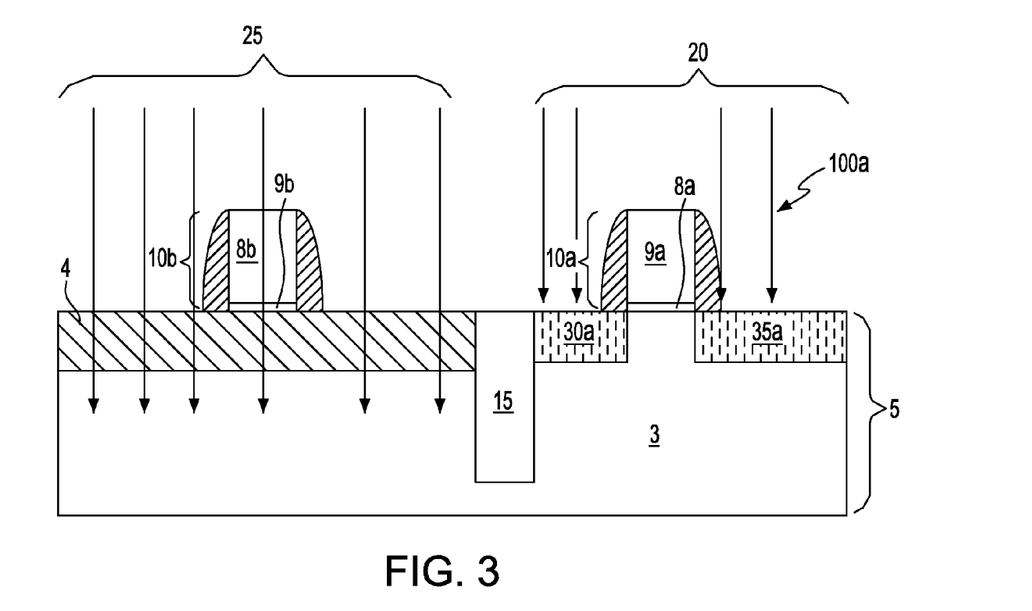
FIG. 3 is a side cross-sectional view depicting laser annealing the structure depicted in FIG. 2 to activate the first source region and the first drain region, in accordance with one embodiment of the present disclosure.

FIG. 3 depicts one embodiment of laser annealing the substrate 5 to activate, i.e., dopant activate, the first source region 30a and the first drain region 35a. "Dopant activation" or "dopant activation" is the process of obtaining an electronic contribution from an impurity species, i.e., dopant, such as p-type or n-type dopant, in a semiconductor host. For example, after ion implantation into the source and drain regions of the semiconductor device, the doping atoms, i.e., p-type or n-type dopants, such as boron (B), arsenic (As) and phosphorus (P), are in interstitial sites of the crystal lattice of the substrate, i.e., silicon (Si) lattice. In some embodiments, upon annealing, such as thermal annealing or laser annealing, the dopant atoms, i.e., n-type or p-type atoms, move to a substitutional position within the lattice and become electrically active, i.e., they provide an electrical contribution to the semiconductor material. As used herein, the term "laser annealing" denotes an annealing method that employs a laser to induce heat in the surface being treated. A laser is an electronic-optical device that emits coherent radiation. In some embodiments, a typical laser emits light in a narrow, low-divergence beam and with a defined wavelength (corresponding to a particular color if the laser operates in the visible spectrum). In some embodiments, the laser type that is employed in the laser annealing method is an excimer laser. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include F$_2$ (fluorine, emitting at 157 nm), and noble gas compounds (ArF (193 nm), KrCl (222 nm), KrF (248 nm), XeCl (308 nm), and XeF (351 nm)).

The laser annealing is selective to only the doped regions, first source region 30a and first drain region 35a, of the semiconductor substrate 5. More specifically, and in some examples, the laser annealing only induces increased thermal heating in the first source region 30a and the first drain region 35a that are present in the first region 20 of the substrate 5 without impacting the second semiconductor material 4, e.g., III-V compound semiconductor material, that is present in the second region 25 of the substrate 5. In one embodiment, the laser annealing of the first source region 30a and the first drain region 35a increases the temperature of these doped regions to a temperature greater than 1000° C. In some embodiments, the laser annealing of the first source region 30a and the first drain region 35a increases the temperature of these doped regions to a temperature ranging from 800° C. to 1300° C. In another embodiment, the laser annealing of the first source region 30a and the first drain region 35a increases the temperature of these doped regions to a temperature ranging from 1000° C. to 1200° C. Typically, because the laser annealing is selective to the first source region 30a and the first drain region 35a in the first region 20 of the substrate 5, the temperature of the second semiconductor material 4 in the second region 25 of the substrate 5 is not raised to ambient temperature, which can range from room temperature, e.g. 25° C. to 400° C.

In one embodiment, activating the first source region 30a and the first drain region 35a includes a laser annealing process having a wavelength ranging from 10 μm to 1 mm. In another embodiment, activating the first source region 30a and the first drain region 35a includes a laser annealing process having a wavelength ranging from 15 μm to 500 mm. In yet another embodiment, activating the first source region 30a and the first drain region 35a includes a laser annealing process having a wavelength ranging from 30 μm to 300 mm. In some embodiments, the energy density of the laser beam at the irradiated surface, i.e., surface to be annealed, falls in a range of 100 mJ/cm$^2$ through 500 mJ/cm$^2$. In another embodiment, the energy density of the laser beam at the irradiated surface falls in a range of 200 mJ/cm$^2$ through 400 mJ/cm$^2$. For example, the energy density of the laser beam at the irradiated surface may be 260 mJ/cm². In some embodiments, the oscillation frequency of the laser is set to 30 Hz and in respect of one point of an irradiated object, 10 through 50 shots of laser beam is irradiated. In some embodiments, in which the laser used in the laser annealing process is an excimer laser, the pulse width of the pulse excimer laser beam is in the range of 20 to 40 nsec and the maximum frequency of the pulse excimer laser beam is, e.g., 300 pulses/sec.

Figure 4:
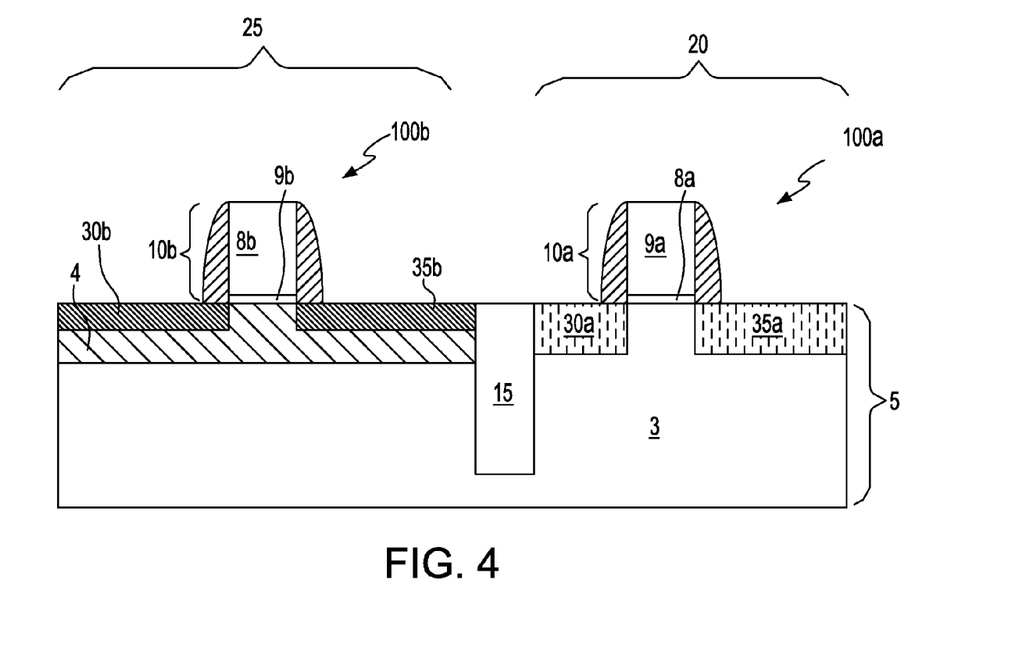
FIG. 4 is a side cross-sectional view depicting forming a second source region and a second drain region in the second region of the substrate, in accordance with one embodiment of the present disclosure.

FIG. 4 depicts one embodiment of forming a second source region 30b and a second drain region 35b in the second region 25 of the substrate 5. The second source region 30b and the second drain region 35b may be formed using ion implantation and may be doped to an n-type or a p-type conductivity. Typically, the second source region 30b and the second drain region 35b are doped to an n-type conductivity. For the III-V semiconductor material that provides the second semiconductor material 4 in the second region 25 of the substrate 5, the effect of the dopant atom, i.e., whether it is a p-type or n-type dopant, depends upon the site occupied by the dopant atom on the lattice of the base material. In one example, the III-V semiconductor material of the second semiconductor material 4 may be doped to an n-type conductivity. In an III-V semiconductor, atoms from Group II act as acceptors, i.e., p-type, when occupying the site of a Group III atom, while atoms in Group VI act as donors, i.e., n-type, when they replace atoms from group V. Dopant atoms from Group IV, such as silicon (Si), have the property that they can act as acceptors or donors depending on whether they occupy the site of Group III or Group V atoms respectively. Such impurities are known as amphoteric impurities. The dopant concentration for the dopant that dictates the conductivity type of the doped portions of the III-V semiconductor material of the second semiconductor material 4 that provides the second source region 30b and the second drain region 35b may range from $10^{15}$ atoms/cm³ to $10^{21}$ atoms/cm³. In another embodiment, the dopant concentration that dictates the conductivity type of the type of the doped portions of the III-V semiconductor material of the second semiconductor material 4 that provides the second source region 30b and the second drain region 35b may range from $10^{16}$ atoms/cm³ to $10^{20}$ atoms/cm³. The second source region 30b and second drain region 35b can also be grown using epitaxial growth.

In some embodiments, to selectively implant the dopant for the second source region 30b and the second drain region 35b in the second region 25 of the substrate 5, a block mask is formed over the first region 20 of the substrate 5 leaving the second region 25 exposed. Following formation of the block mask, the exposed portion of the second semiconductor material 4 in the second region 25 of the substrate 5 is ion implanted to provide n-type semiconductor devices. Thereafter, the block mask is removed. The block mask may comprise soft and/or hardmask materials and can be formed using deposition, photolithography and etching.

The second source region 30b and the second drain region 35b may then be activated using a thermal activation anneal. Examples of thermal activation anneals include rapid thermal anneal, also referred to as rapid thermal processing, and furnace annealing. The temperature of the thermal activation anneal for activating the second source region 30b and the second drain region 35b is 700° C. or less. For example, the thermal activation anneal for activating the second source region 30b and the second drain region 35b may range from 300° C. to 600° C. In another example, the thermal activation anneal for activating the second source region 30b and the second drain regions 35b may range from 350° C. to 550° C. After anneal, the devices can follow normal semiconductor processing such as silicide and metal via connection formation.

FIGS. 1-4 depict one embodiment of a method of forming planar semiconductor devices. It is noted that the above method is not limited to only semiconductor devices. For example, the above described method of activating the source and drain regions of a semiconductor device is equally applicable to fin field effect transistors (finFETs). As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

Figure 5:
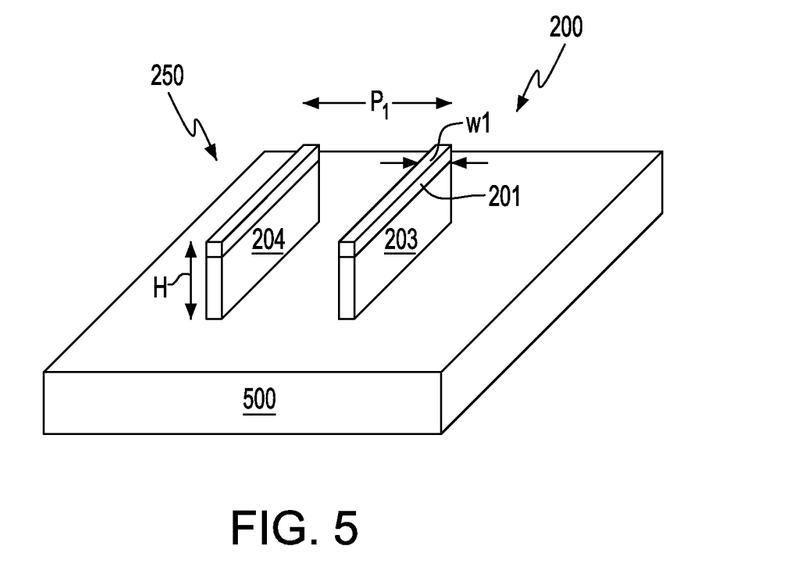
FIG. 5 is a perspective view depicting one embodiment of a first fin structure in a first region of a substrate composed of a first semiconductor material and a second fin structure in a second region of the substrate composed of a second semiconductor material, in accordance with one embodiment of the present disclosure.

FIG. 5 depicts one embodiment of a first fin structure 200 in a first region of a substrate 5 composed of a first semiconductor material 203 and a second fin structure 250 in a second region of the substrate 5 composed of a second semiconductor material 204. The description of the composition for the first semiconductor material 3 in the first region 20 of the substrate 5 that is depicted in FIG. 1 is suitable for the description of the composition of first semiconductor material 203 of the first fin structure 200 that is depicted in FIG. 5. The description of the composition for the second semiconductor material 4 in the second region 25 of the substrate 5 that is depicted in FIG. 1 is suitable for the description of the composition of second semiconductor material 204 of the first fin structure 200 that is depicted in FIG. 5. The first and second fin structures 200, 250 may be present on a substrate 500 that can be composed of a dielectric, such as silicon oxide or silicon nitride. Other dielectric materials that are suitable for the substrate 500 include aluminum oxide and silicon carbide.

Each of the first fin structure 200 and the second fin structure 250 may have a height H1 ranging from 5 nm to 200 nm. In one embodiment, each of the first fin structure 200 and the second fin structure 250 may have height H1 ranging from 10 nm to 100 nm. In another embodiment, of the first fin structure 200 and the second fin structure 250 may have a height H1 ranging from 15 nm to 50 nm. Each of the first fin structure 200 and the second fin structure 250 may have a width W1 ranging from 5 nm to 50 nm. In another embodiment, each of the first fin structure 200 and the second fin structure 250 may have width W1 ranging from 8 nm to 20 nm. Adjacent fin structures may be separated by a pitch P1 ranging from 20 nm to 100 nm. In one embodiment, adjacent fin structures may be separated by a pitch P1 ranging from 30 nm to 50 nm. In some embodiments, each of the first fin structure 200 and the second fin structure 250 may include a dielectric cap 201 that is present on the upper surface of each of the first fin structure 200 and the second fin structure 250. The dielectric cap 201 may be an oxide, nitride or oxynitride material. For example, the dielectric cap 201 may be composed of silicon oxide or silicon nitride.

Figure 6:
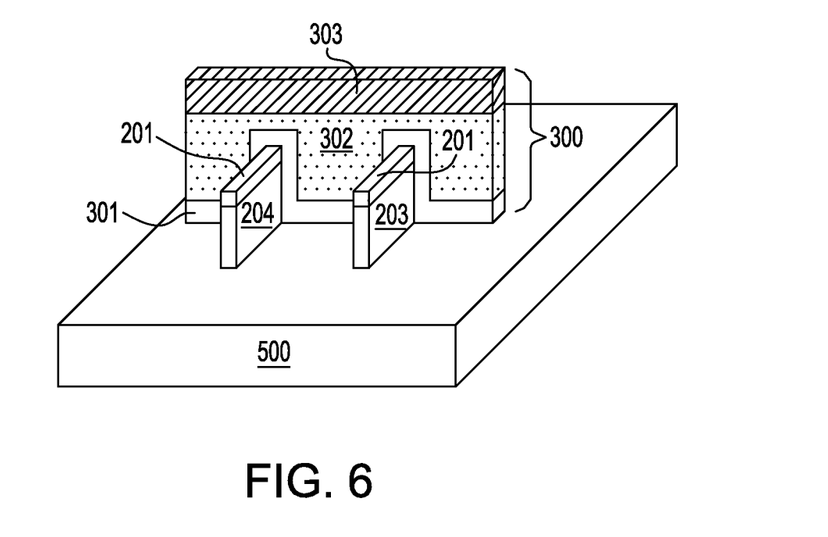
FIG. 6 is a perspective view depicting forming a gate structure to the first fin structure and the second fin structure, in accordance with one embodiment of the present disclosure.

FIG. 6 depicts one embodiment of forming a gate structure 300 to the first fin structure 200 and the second fin structure 250. In one embodiment, the gate structure 300 includes at least one gate dielectric layer 301 and at least one gate conductor layer 302. The above description of forming the first and second gate structures 10a, 10b that are depicted in FIG. 1 is suitable for forming the gate structure 300 that depicted in FIG. 6. For example, the description of the composition of the first gate conductor 9a and the second gate conductor 9b that are depicted in FIG. 1 is suitable for the at least one gate conductor 302 that is depicted in FIG. 9. The description of the composition of the first gate dielectric 8a and the second gate dielectric 8b that are depicted in FIG. 1 is suitable for the at least one gate dielectric 301 that is depicted in FIG. 9. In some embodiments, the gate structure 300 may includes a gate cap 303. The gate cap 303 may be an oxide, nitride or oxynitride material. For example, the gate cap 303 may be composed of silicon oxide or silicon nitride. Although FIG. 6 depicts a single gate structure 300 to the first fin structure 200 and the second fin structure 250, the present disclosure is not limited to only this embodiment. For example, embodiments have been contemplated in which a separate gate structure is formed for each of the first fin structure 200 and the second fin structure 250.

Figure 7:
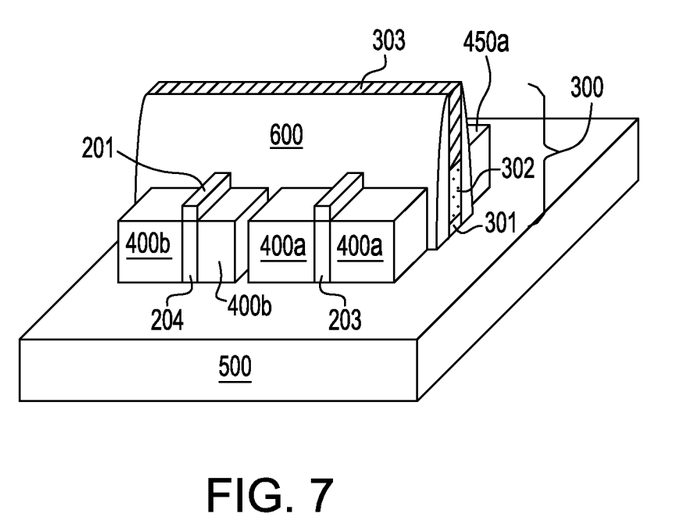
FIG. 7 is a perspective view of forming source and drain regions to the first fin structure and the second fin structure, in accordance with one embodiment of the present disclosure.

FIG. 7 depicts one embodiment of forming source and drain regions 400a, 400b, 450a, to the first fin structure 200 and the second fin structure 250 (it is noted that the drain region to the second fin structure 250 is not depicted, because it is hidden behind the gate structure 300). In some embodiments, before forming the source and drain regions 400a, 400b, 450a, a dielectric spacer 600 may be formed adjacent to the sidewall of the gate structure 300. The dielectric spacer 600 may be composed of an oxide, nitride or oxynitride material. In one example, when the dielectric spacer 600 is composed of an oxide, the dielectric spacer 600 may be composed of silicon oxide. In another example, when the dielectric spacer 600 is composed of a nitride, the dielectric spacer 600 may be composed of silicon nitride. The dielectric spacer 600 may be formed using a deposition process, such as chemical vapor deposition, followed by an etch back process, such as reactive ion etch.

In some examples, following the formation of the dielectric spacer 600, the exposed portions of the first fin structure 200 and the second fin structure 250 may be doped to provide source and drain extension regions. The source and drain extension regions may be doped to an n-type or p-type conductivity by ion implantation. For example, the first semiconductor material 203, such as a silicon containing semiconductor material, of the first fin structure 200 may be doped to provide source and drain extension regions having a p-type conductivity. In some embodiments, the source and drain extension regions may be formed in the exposed portion of the first semiconductor material 203 of the first fin structure 200, while the second fin structure 250 is protected by a block mask, such as a photoresist mask. The above description of forming the first source region 30a and the first drain region 35a that are depicted in FIG. 2 may be suitable to describe the formation of the source and drain extension regions that are formed in the first semiconductor material 203 of the first fin structure 200 that is depicted in FIG. 7. Following formation of the source and drain extension regions on the first fin structure 200, an epitaxial source region and an epitaxial drain region are formed on the source and drain regions. The epitaxial source region and the epitaxial drain region is formed using an epitaxial deposition process. In some examples, a block mask may be formed over the second region of the substrate to obstruct the epitaxially formed material that provides the epitaxial source region and the epitaxial drain region from being formed on the second fin structure 250. The block mask may be removed from the second region of the substrate 500 after forming the epitaxial source region and the epitaxial drain region on the exposed surfaces of the first fin structure 200.

The epitaxial source region and the epitaxial drain region may be composed of the same material as the first semiconductor material 203. For example, when the first semiconductor material 20 is a type IV semiconductor material, such as silicon, the epitaxial source region and the epitaxial drain region may also be composed of silicon. Typically, the epitaxial source region and the epitaxial drain region is doped to the same conductivity as the source and drain extension regions. For example, when the first semiconductor material 203 of the first fin structure 200 is doped to provide source and drain extension regions having a p-type conductivity, the epitaxial source region and the epitaxial drain region is also doped to have a p-type conductivity. In the embodiment depicted in FIG. 7, the first source region to the first fin structure 200 is identified by reference number 400a and includes a source extension region and an epitaxial source region. In the embodiment depicted in FIG. 7, the first drain region to the first fin structure 200 is identified by reference number 450a and includes a drain extension region and an epitaxial drain region.

The first source region 400a and the first drain region 450a may be activated using a laser anneal process, as described above with reference to FIG. 3. For example, activating the first source region 400a and the first drain region 450a may include a laser annealing process having a wavelength ranging from 10 µm to 1 mm. In another embodiment, activating the first source region 400a and the first drain region 450a includes a laser annealing process having a wavelength ranging from 15 µm to 500 mm. The laser annealing process is selective to the first source region 400a and the first drain region 450a, and does not impact the second semiconductor material 204, e.g., the III-V compound semiconductor material, that is present in the second region of the substrate 5. For example, the second semiconductor material 204, e.g., the III-V compound semiconductor material, that is present in the second region of the substrate 5 may be at room temperature, e.g., 20° C. to 25° C., throughout the laser annealing process.

Following activation of the first source region 400a and the first drain region 450a with the laser annealing process, a second source region 400b and a second drain region (not depicted in FIG. 7 because it is hidden behind the gate structure 300) may be formed on the second fin structure 250 in the second region of the substrate 500. The second source region 400b may include a source extension region and an epitaxial source region. The second drain region may include a drain extension region and an epitaxial drain region. The source and drain extension regions may have an n-type or p-type conductivity, and may be formed into the second semiconductor material 204 of the second fin structure 250 using ion implantation. For example, the source and drain extension regions may have an n-type conductivity. In some embodiments, a block mask may be formed on the first region of the substrate to protect the first fin structure 200 from being doped with the dopant used to form the source and drain extension regions in the second fin structure 250. In some embodiments, the source and drain extension regions for the second fin structure 250 are similar to the second source region 30b and the second drain region 35b that are depicted in FIG. 4. Therefore, further details regarding forming the source and drain extension regions in the second semiconductor material 204 of the second fin structure 200 that are depicted in FIG. 7 may be provided by the description of forming the second source region 30b and the second drain region 35b that are depicted in FIG. 4.

Following the formation of the source and drain extension regions, epitaxially formed source regions and drain regions (hereafter referred to as "epitaxial source and drain regions") may be formed on the portions of the second fin structures 250 including the source and drain extension regions. The epitaxial source regions and epitaxial drain regions have a conductivity that is typically similar to the conductivity of the source and drain extension regions. For example, the epitaxial formed source and drain regions that are formed on the portions of the second fin structures 250 including the source and drain extension regions may have an n-type conductivity. The epitaxial source and drain regions may also have the same composition as the second semiconductor material 204 of the second fin structure 200. For example, the epitaxial source and drain regions may be composed of a III-V compound semiconductor.

The second source region 400b and the second drain region may then be activated using a thermal anneal. The thermal anneal that is employed to activate the second source region 400b and the second drain region that are depicted in FIG. 7 may be similar to the thermal anneal that activate the second source region 30b and the second drain region 35b that are depicted in FIG. 4. Therefore, the above description of the thermal anneal that is employed to activate the second source region 30b and the second drain region 35b that are depicted in FIG. 4 is suitable for the thermal anneal that is employed to activate the second source region 400b and the second drain region that are depicted in FIG. 7.

FIGS. 1-7 depict methods of forming a semiconductor device using a gate first process. In another embodiment, the process sequence for forming the semiconductor devices includes a gate last process sequence, which is not depicted in the supplied figures. A gate last process includes forming a replacement gate structure on the channel portion of the semiconductor device, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a substrate having a first region of a first semiconductor material and a second region of a second semiconductor material, wherein a topmost surface of said first region of the first semiconductor material and a topmost surface of said second region of the second semiconductor material are coplanar;
   forming a first gate structure in the first region of the substrate and a second gate structure in the second region of the substrate;
   forming a first source region and a first drain region in the first region of the substrate, wherein dopant for the first source region and the first drain region is not present into the second region;
   laser annealing an entire exposed portion of said topmost surface of said first region of the substrate and an entire exposed portion of said topmost surface of said second region of the substrate, wherein said laser anneal activates only the first source region and first drain region, and wherein said laser anneal does not impact said second region of said substrate;
   forming a second source region and a second drain region in the second region of the substrate after the activating of the first source region and the first drain region; and
   activating the second source region and the second drain region.

2. The method of claim 1, wherein the first semiconductor material comprises a semiconductor material from type IV of the Periodic Table of Elements.

3. The method of claim 2, wherein the material from type IV of the Periodic Table of Elements is selected from the group consisting of silicon (Si), germanium (Ge), silicon germanium (SiGe) and combinations thereof.

4. The method of claim 1, wherein the second semiconductor material comprises a compound semiconductor.

5. The method of claim 4, wherein the compound semiconductor is selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

6. The method of claim 1, wherein said forming the first gate structure and the second gate structure comprises:
   depositing a dielectric layer on the semiconductor substrate for each of said first gate structure and said second gate structure;
   depositing a gate conductor layer on the dielectric layer to form a gate stack; and
   etching the gate stack to form said first gate structure in the first region and said second gate structure in the second region.

7. The method of claim 1, wherein said forming the first gate structure and the second gate structure comprises:
   forming a sacrificial gate structure in the first region and the second region of the semiconductor substrate;
   forming said first and second source region and said first and second drain region in the substrate; and
   replacing the sacrificial gate structure with a functional gate structure.

8. The method of claim 1, wherein the forming of the first source region and the second source region comprises ion implantation of a p-type dopant.

9. The method of claim 1, wherein the p-type dopant is present in the first source region and the second source region at a concentration ranging from $1\times10^{19}$ atoms/cm$^3$ to $1\times10^{21}$ atoms/cm$^3$.

10. The method of claim 1, wherein a block mask is formed on the second region of the substrate, wherein the block mask protects the second region of the substrate during said forming of the first source region and the first drain region into the substrate.

11. The method of claim 1, wherein the laser annealing comprises a wavelength ranging from 1 µm to 1 mm.

12. The method of claim 1, wherein said forming of said second source region and said second drain region in the second region of the substrate comprises ion implanting an n-type dopant.

13. The method of claim 1, wherein said activating the second source region comprises an anneal at a temperature of less than 700° C.

14. The method of claim 1, wherein the first region and the second region comprises planar semiconductor devices.

15. The method of claim 1, wherein the first region and the second region comprises fin field effect transistors.

16. A method of forming a semiconductor device comprising:

provviding a substrate having a first region of a type IV semiconductor material and a second region of a compound semiconductor, wherein a topmost surface of said first region of the type IV semiconductor material and a topmost surface of said second region of the compound semiconductor material are coplanar;

forming a first gate structure in a first region of the substrate and a second gate structure in a second region of the substrate;

implanting a first source region and a first drain region in the first region of the substrate, wherein dopant for the first source region and the first drain region is not implanted into the second region;

laser annealing an entire portion of said first region of the substrate and an entire portion of said second region of the substrate, wherein said laser anneal activates only the first source region and first drain region, and wherein said laser anneal does not impact said second region of said substrate;

implanting a second source region and a second drain region in the second region of the substrate after the activating of the first source region and the first drain region; and activating the second source region and the first source region with a thermal anneal at a temperature of 700° C. or less.

17. The method of claim 16, wherein the type IV semiconductor material is selected from the group consisting of silicon (Si), germanium (Ge), silicon germanium (SiGe) and combinations thereof.

18. The method of claim 16, wherein the compound semiconductor is selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

19. The method of claim 16, wherein the first region and the second region comprises planar semiconductor devices.

20. The method of claim 16, wherein the first region and the second region comprises fin field effect transistors.

* * * * *